(12) United States Patent
Yin

(10) Patent No.: US 11,748,249 B2
(45) Date of Patent: Sep. 5, 2023

(54) FINE GRAIN LEVEL MEMORY POWER CONSUMPTION CONTROL MECHANISM

(71) Applicant: Samsung Electronics Co., Ltd., Suwon-si (KR)

(72) Inventor: Liang Yin, San Jose, CA (US)

(73) Assignee: SAMSUNG ELECTRONICS CO., LTD.

( * ) Notice: Subject to any disclaimer, the term of this patent is extended or adjusted under 35 U.S.C. 154(b) by 0 days.

(21) Appl. No.: 17/744,615

(22) Filed: May 13, 2022

(65) Prior Publication Data

US 2022/0276955 A1    Sep. 1, 2022

Related U.S. Application Data

(63) Continuation of application No. 15/143,500, filed on Apr. 29, 2016, now abandoned.

(60) Provisional application No. 62/279,664, filed on Jan. 15, 2016.

(51) Int. Cl.
*G11C 5/14* (2006.01)
*G06F 12/00* (2006.01)
*G06F 1/3234* (2019.01)
*G06F 1/3225* (2019.01)
*G11C 5/04* (2006.01)

(52) U.S. Cl.
CPC .......... *G06F 12/00* (2013.01); *G06F 1/3225* (2013.01); *G06F 1/3275* (2013.01); *G11C 5/148* (2013.01); *G11C 5/04* (2013.01); *Y02D 10/00* (2018.01); *Y02D 30/50* (2020.08)

(58) Field of Classification Search
CPC .......... G06F 1/3225; G06F 12/00; G11C 5/14
USPC ........................................... 365/227
See application file for complete search history.

(56) References Cited

U.S. PATENT DOCUMENTS

| 6,597,621 | B2 | 7/2003 | Tsuji et al. |
| 6,618,791 | B1 | 9/2003 | Dodd et al. |
| 7,099,234 | B2 | 8/2006 | Parris et al. |
| 7,460,428 | B2 | 12/2008 | Joo et al. |
| 7,570,209 | B2 | 8/2009 | Shi et al. |
| 7,796,458 | B2 | 9/2010 | Rao |
| 7,848,172 | B2 | 12/2010 | Dudeck et al. |
| 7,904,658 | B2 | 3/2011 | Abadeer et al. |
| 8,988,933 | B2 * | 3/2015 | Takizawa .............. G06F 3/0673 365/158 |
| 9,240,245 | B1 | 1/2016 | Bellorado et al. |

(Continued)

OTHER PUBLICATIONS

Cooper-Balis, Elliot et al., "Fine-Grained Activation For Power Reduction in DRAM," IEEE MICRO3, May/June 010, pp. 34-47.*

(Continued)

*Primary Examiner* — Muna A Techane
(74) *Attorney, Agent, or Firm* — Renaissance IP Law Group LLP

(57) ABSTRACT

According to one general aspect, an apparatus may include a memory module. The memory module may include a plurality of memory banks configured to store data. The memory module may include a plurality of memory bank power down controllers, each configured to place one or more respective memory bank(s) in a power down mode. The memory module may include a memory module command interface configured to receive a handshake command from a memory controller, wherein the handshake command comprises a command to remove an indicated memory bank from power down mode.

6 Claims, 6 Drawing Sheets

(56) References Cited

U.S. PATENT DOCUMENTS

| | | | | |
|---|---|---|---|---|
| 9,633,713 | B2* | 4/2017 | Smith | G11C 11/408 |
| 2002/0159322 | A1* | 10/2002 | Choi | G11C 5/143 |
| | | | | 365/226 |
| 2005/0231991 | A1 | 10/2005 | Horiguchi et al. | |
| 2007/0008802 | A1* | 1/2007 | Joo | G11C 11/4087 |
| | | | | 365/226 |
| 2015/0277541 | A1* | 10/2015 | Jain | G06F 1/3225 |
| | | | | 713/320 |
| 2017/0115723 | A1* | 4/2017 | Shurin | G06F 1/3268 |

OTHER PUBLICATIONS

Jacob, Bruce et al.,"Memory Systems Cache, DRAM,Disk", Morgan Kaupmann Publishers,Elsevier,2008,11 pages.*
Cooper-Balis, Elliot et al., "Fine-Grained Activation for Power Reduction in DRAM," IEEE Micro 3, May/Jun. 2010, pp. 34-47.
Final Office Action for U.S. Appl. No. 15/143,500, dated Aug. 27, 2018.
Final Office Action for U.S. Appl. No. 15/143,500, dated May 17, 2019.
Final Office Action for U.S. Appl. No. 15/143,500, dated Oct. 15, 2020.
Jacob, Bruce et al., "Memory Systems Cache, DRAM, Disk", Morgan Kaupmann Publishers, Elsevier, Burlington, MA, USA, 1 page.
Office Action for U.S. Appl. No. 15/143,500, dated Apr. 13, 2020.
Office Action for U.S. Appl. No. 15/143,500, dated Dec. 12, 2018.
Office Action for U.S. Appl. No. 15/143,500, dated Feb. 23, 2018.

* cited by examiner

300

500

FINE GRAIN LEVEL MEMORY POWER CONSUMPTION CONTROL MECHANISM

CROSS-REFERENCE TO RELATED APPLICATION

This application is a continuation of U.S. patent application Ser. No. 15/143,500, filed on Apr. 29, 2016, which claims priority under 35 U.S.C. § 119 to U.S. Provisional Patent Application Ser. No. 62/279,664, filed on Jan. 15, 2016. The subject matter of these earlier filed applications are hereby incorporated by reference.

TECHNICAL FIELD

This description relates to memory management, and more specifically to power management of memory devices.

BACKGROUND

Memory power consumption is often a major component of total energy consumed by a computing system. As demand for larger memory capacity increases, it is frequently desirable to reduce the amount of power consumed by memory devices. Generally memory devices, for example dynamic random access memory (DRAM) or system memory, have a number of power saving mechanisms. Often at least some of these mechanisms include different power down and/or stand-by modes. These power savings mechanisms generally apply to the memory device as a whole, that is the full device is in a single power mode (e.g., power down mode). The memory device will be entirely powered down or entirely in a high power mode.

As an example of a low power mode, deep power-down (a very low power consumption mode) puts one or more of the memory devices in to deep power-down mode. In one example, in the ARM architecture a specific command (DPD) must be received by the memory device before it will enter deep power down mode. The process of entering deep power down mode is destructive, in that the data stored in the memory device is erased, e.g., in the case of DRAM, as power is no longer applied to the memory cells. Therefore, when a memory device exits from deep power-down mode, the device must be initialized prior to it being accessible to the system for storage.

SUMMARY

According to one general aspect, an apparatus may include a memory module. The memory module may include a plurality of memory banks configured to store data. The memory module may include a plurality of memory bank power down controllers, each configured to place one or more respective memory bank(s) in a power down mode. The memory module may include a memory module command interface configured to receive a handshake command from a memory controller, wherein the handshake command comprises a command to remove an indicated memory bank from power down mode.

According to another general aspect, an apparatus may include a memory controller circuit, a plurality of power down trigger predictors, and a command interface. The memory controller circuit may be configured to manage a flow of data going to and from a memory module. The plurality of power down trigger predictors may each be associated with a memory bank of the memory module. Each power down trigger predictor may be configured to predict if a respective memory bank is in a power down mode. The command interface may be configured to transmit a handshake command to the memory module, wherein the handshake command is configured to remove an indicated memory bank from power down mode.

According to another general aspect, a system may include a memory controller and a memory module. The memory controller may include a command interface configured to transmit a handshake command to a memory module. The handshake command may be configured to remove an indicated memory bank from power down mode. The memory module may include a plurality of memory banks configured to store data. The memory module may include a plurality of memory bank power down controllers, each configured to place a respective memory bank in a power down mode. The memory module may include a memory module command interface configured to receive the handshake command.

According to another general aspect, a method may include determining if a memory access is to a target memory bank of a memory module, wherein the memory module comprises a plurality of memory banks. The method may include, if not, incrementing a counter associated with the target memory bank. The method may include determining if the counter has exceeded a threshold value. The method may include, if the counter has exceeded the threshold value, placing only the target memory bank in a power down mode, wherein at least one other memory bank of the memory module is not in the power down mode.

The details of one or more implementations are set forth in the accompanying drawings and the description below. Other features will be apparent from the description and drawings, and from the claims.

A system and/or method for memory management, and more specifically to power management of memory devices, substantially as shown in and/or described in connection with at least one of the figures, as set forth more completely in the claims.

BRIEF DESCRIPTION OF THE DRAWINGS

Like reference symbols in the various drawings indicate like elements.

DETAILED DESCRIPTION

Figure 1:
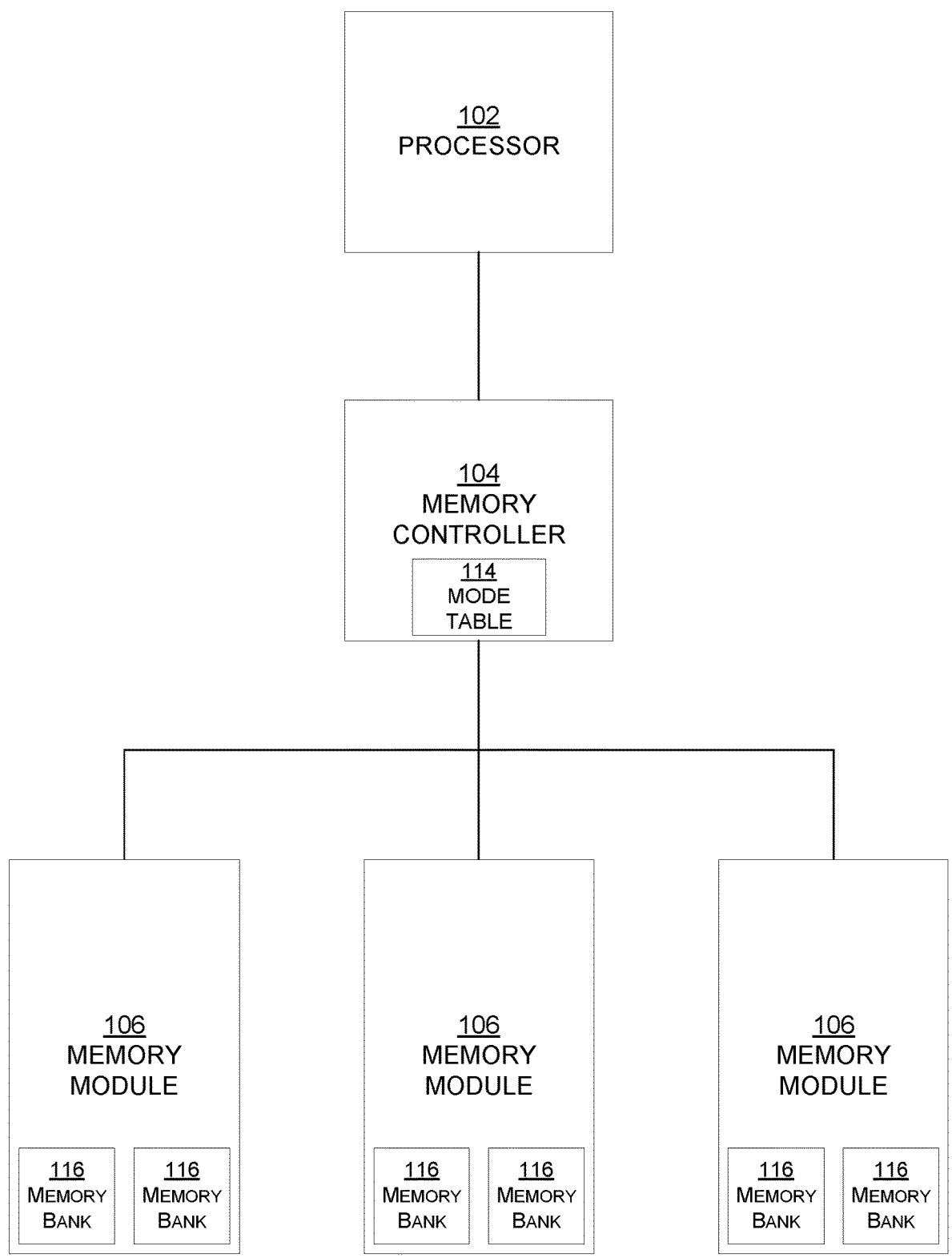
FIG. 1 is a block diagram of an example embodiment of a system in accordance with the disclosed subject matter.

Various example embodiments will be described more fully hereinafter with reference to the accompanying drawings, in which some example embodiments are shown. The present disclosed subject matter may, however, be embodied in many different forms and should not be construed as limited to the example embodiments set forth herein. Rather, these example embodiments are provided so that this disclosure will be thorough and complete, and will fully convey the scope of the present disclosed subject matter to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present disclosed subject matter.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosed subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosed subject matter.

Unless otherwise defined, all terms (including technical and scientific terms) used herein have the same meaning as commonly understood by one of ordinary skill in the art to which this disclosed subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a block diagram of an example embodiment of a system 100 in accordance with the disclosed subject matter. In various embodiments, the system 100 may include a computer that includes discrete parts (e.g., a processor chip, a chipset, a series of memory modules, etc.), an integrated system-on-a-chip (SoC), or a system with a partial amount of integration (e.g., the processor and memory controller may be integrated, etc.). It is understood that the above are merely a few illustrative examples to which the disclosed subject matter is not limited.

In the illustrated embodiment, the system 100 may include a processor 102. The processor 102 may be configured to execute various instructions. As part of the execution of the instructions, the processor 102 may access (e.g., read from, write to, etc.) a memory or data storage (e.g., memory module 106). As part of the memory access, the processor 102 may make a memory access request to a memory controller 104.

In the illustrated embodiment, the system 100 may include a memory controller 104. The memory controller 104 may be configured to manage a flow of data going to and from one or more memory modules 106. In one embodiment, the memory controller 104 may be configured to receive memory access requests from the processor 102 (or other initiating device) and respond to the memory access request (e.g., by fulfilling the request or informing the initiating device that the request will be unfulfilled, at least temporarily). As described above, in various embodiments, the memory controller 104 may be integrated or included as part of the processor 102. It is understood that the above is merely one illustrative example to which the disclosed subject matter is not limited.

In the illustrated embodiment, the system 100 may include one or more memory modules 106. In some embodiments, the memory modules 106 may be described as system memory and may include DRAM circuits. In various embodiments, the memory modules 106 may include dual in-line memory modules (DIMMs). It is understood that the above are merely a few illustrative examples to which the disclosed subject matter is not limited.

In various embodiments, each of the memory modules 106 may be configured to operate in one of a plurality of modes. For example, one mode may include operating at a high, normal, or traditional power consumption level. A second mode may be a reduced or power down level of power consumption. And, a third mode may include a deep power down mode that uses very little (comparatively) power. It is understood that the above are merely a few illustrative examples to which the disclosed subject matter is not limited.

In various embodiments, the entire memory module 106 may be configured to operate in one of these power modes at a time. In such an embodiment, if any part of the memory module is in a deep power down mode, the entire memory module 106 would be in a deep power down mode. However, in the illustrated embodiment, the memory modules 106 may be capable of operating in a plurality of power modes simultaneously.

For example, each memory module 106 may include a plurality of sub-portions or memory banks 116. In such an embodiment, one memory bank 116 may be heavily used or accessed. That memory bank 116 may be operating in a normal or high power mode. Conversely, another memory bank 116 may not be accessed very much, if at all. In such an embodiment, the memory module 106 may put that infrequently accessed memory bank 116 into a lower power mode (e.g., deep power down mode).

Traditionally, the entire memory module 106 may only be allowed to operate in one power mode. If a single memory bank 116 is being used the entire memory module 106 would have to operate in a high power mode, even if all the other memory banks 116 were not being accessed. In the illustrated embodiment, the memory module 106 may be able to operate various portions of the memory module 106 in different power modes. This may reduce power consumption (compared to the traditional case) while still providing access to a portion of the memory module 106.

In the illustrated embodiment, the memory controller 104 may include a mode table 114. The mode table 114 may be configured to maintain a list of the memory banks 116 and their respective current operating modes. For example, if the processor 102 requests a memory access from a particular memory bank 116, the memory controller 104 may be configured to check with the mode table 114 to determine the current operating mode of the target memory bank 116. If the target memory bank 116 is in an operating mode that can facilitate memory accesses, the memory controller 104 may forward the memory access request to the appropriate memory module 106. Conversely, if the target memory bank 116 is in an operating mode that cannot facilitate memory accesses (e.g., deep power down mode, etc.) the memory controller 104 may indicate that the memory access request cannot be fulfilled. In various embodiments, this may include issuing a cache miss and removing the memory bank 116 from the unresponsive power mode. It is understood that the above is merely one illustrative example to which the disclosed subject matter is not limited.

As described below in reference to the other figures, the system 100 may employ a fine grain power consumption control mechanism that allows the system 100 (or memory modules 106) to adjust the operating power modes of various sub-structures without substantially impacting other portions of the memory modules 106. As described above, each memory module 106 may include a plurality of substantially identical sub-structures (e.g., memory banks 116), of which only a small number might be accessed at any given moment or time period. The ability to power down (at least partially) any unused sub-structures may significantly save power consumption.

Also as described below in reference to the other figures, these memory modules 106 may include or make use of a triggering mechanism to determine when a particular sub-structure is to be powered down (or awoken). In various embodiments, the triggering mechanism may include a state machine, or a counter and threshold device. In some embodiments, each sub-structure may be associated with its own respective triggering mechanism. In another embodiment, one triggering mechanism may control a plurality of sub-structures, for example in groups. It is understood that the above are merely a few illustrative examples to which the disclosed subject matter is not limited.

Further, as described below in reference to the other figures, the memory controller 104 and memory modules 106 may employ a communication protocol or handshake mechanism to manage the sub-structure's power modes. In such an embodiment, the memory controller 104 may be configured to send a special signal or meaningful message to wake up a sub-structure from a low power mode. In some embodiments, the memory controller's 104 ability to see memory access requests prior to the memory module 106 may be exploited to wake up a sleeping (powered down) sub-structure in time for it to respond to a memory access request, and if not a first request then a subsequent request. It is understood that the above are merely a few illustrative examples to which the disclosed subject matter is not limited.

Figure 2:
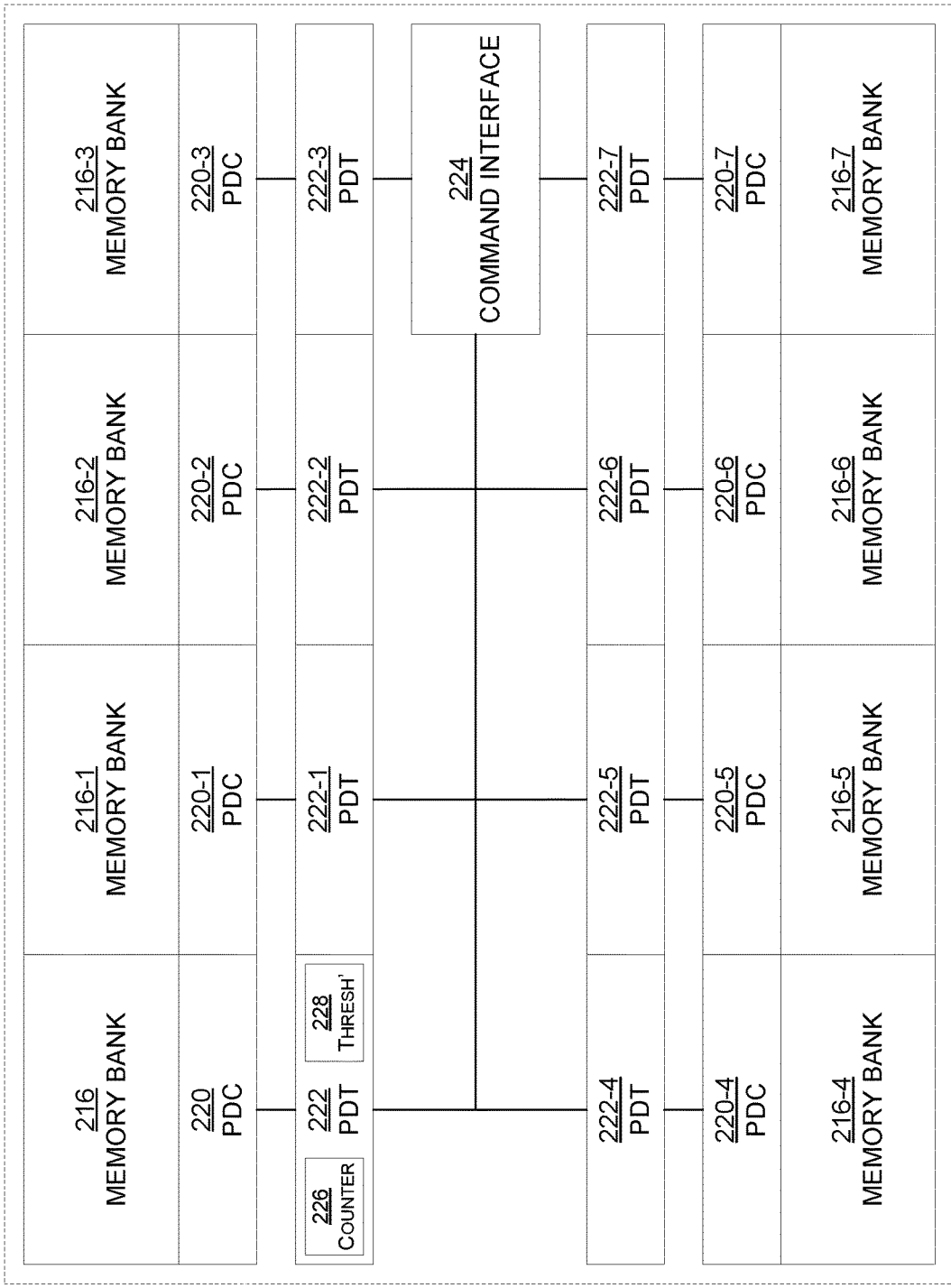
FIG. 2 is a block diagram of an example embodiment of an apparatus in accordance with the disclosed subject matter.

FIG. 2 is a block diagram of an example embodiment of an apparatus 200 in accordance with the disclosed subject matter. In various embodiments, the apparatus 200 may include a memory module or other memory device. In such an embodiment, the apparatus 200 may be configured to store various pieces of data.

In the illustrated embodiment, the apparatus 200 may include a plurality of memory banks 216 or other sub-structures. In the illustrated embodiment, the apparatus 200 may include, but is not limited to, eight memory banks 216, 216-1, 216-2, 216-3, 216-4, 216-5, 216-6, and 216-7. Each memory bank 216 may be configured to store data. When a memory access request (e.g., a read request, a write request) occurs the memory bank 216 that stores the data or includes the memory address that is the subject of the memory access may be referred to as the target memory bank 216. When the memory bank 216 is in a high powered or normal operating mode, the data stored in the target memory bank 216 may be accessed and used to fulfill the request.

In the illustrated embodiment, the apparatus 200 may include a plurality of memory bank power down controllers (PDCs) 220. Each PDC 220 may be configured to control the operating mode of a respective memory bank 216. More specifically, each PDC 220 may be configured to either place the respective memory bank 216 in a power down mode (e.g., deep power down mode) or to wake-up the respective memory bank 216 from a power down mode (e.g., place it back into a normal or high power consumption operational mode). In the illustrated embodiment, eight PDCs 220 are shown: PDCs 220, 220-1, 220-2, 220-3, 220-4, 220-5, 220-6, and 220-7; it is understood that the above is merely one illustrative example to which the disclosed subject matter is not limited.

In various other embodiments, the memory banks 216 and PDCs 220 may not exist in a 1:1: ratio. In such an embodiment, a single PDC 220 may be configured to control a plurality of memory banks 216. In one embodiment, a single PDC 220 may control a plurality of memory banks 216 as a group. In another embodiment, a PDC 220 may still control a plurality of memory banks 216 individually, but communicate via a bus and a bank-address-based protocol. It is understood that the above are merely a few illustrative examples to which the disclosed subject matter is not limited.

In the illustrated embodiment, the apparatus 200 may include a plurality of memory bank power down triggers (PDTs) 222. Each PDT 220 may be configured to determine if a memory bank 216 should enter a particular power down mode (e.g., deep power down mode). In the illustrated embodiment, eight PDTs 222 are shown: PDTs 222, 222-1, 222-2, 222-3, 222-4, 222-5, 222-6, and 222-7; it is understood that the above is merely one illustrative example to which the disclosed subject matter is not limited. Each PDT 222 may be associated with a respective memory bank 216. Again, as described above, other embodiments may exist in which the ratio of PDTs 222 to memory banks 216 is not 1:1.

In the illustrated embodiment, each of the PDTs 222 may include a sleep counter 226 configured to store a value associated with a power mode of a respective memory bank 216. The PDT 222 may also include a sleep threshold 228 configured to indicate a threshold value associated with a respective power mode. In such an embodiment, the value of the of the sleep counter 226 may be compared to the sleep threshold 228, when the sleep counter 226 value is equal to or greater than the sleep threshold 228 value, the respective memory bank may be placed in the power down mode. In various embodiments, the sleep threshold 228 may be fixedly set, predetermined, or predefined. In other embodiments, the sleep threshold 228 may be set via a command or otherwise programmatically set. For example, a command may be received via the command interface 224 that sets the value of the sleep threshold 228. All of the sleep thresholds 228 may store the same value or may store different values. It is understood that the above are merely a few illustrative examples to which the disclosed subject matter is not limited.

In various embodiments, a number of different things may be measured by the sleep counter 226 and used to determine when the memory bank 216 should be placed into a power down mode. For example, in one embodiment, the sleep counter 226 may count a time period (e.g., clock cycles) since its respective memory bank 216 was the target of a memory access. When the unused time period exceeds the value dictated by the sleep threshold 228, the PDT 222 may instruct the PDC 220 to put the memory bank 216 into a power down mode. In another embodiment, the sleep counter 216 may count the number of memory accesses since the last time the memory bank 216 was targeted. In yet another embodiment, the sleep counter 216 may count a certain type of memory access that occur. It is understood that the above are merely a few illustrative examples to which the disclosed subject matter is not limited.

In the illustrated embodiment, the apparatus 200 may include a memory module command interface 224. The command interface 224 may be configured to receive commands from an external device (e.g. a memory controller). In the illustrated embodiment, the command interface 224 may be configured to receive a handshake command from a memory controller. The handshake command may be configured to remove an indicated or targeted memory bank from power down mode. In such an embodiment, the command interface may instruct the PDC 220 associated with the targeted memory bank 216 to remove the memory bank 216 from a first power down mode (e.g., deep power down mode) and place it in a second power mode (e.g., a high power or normal operating mode).

In such an embodiment, each memory bank 216 may automatically be placed in a power down mode by the PDT 222 and then be awoken via a handshake command from the memory controller. As described below, the memory controller may be aware that a memory bank is the target of a memory access before the memory module or apparatus 200 is aware. As such, the memory controller may be able to begin the process of waking a particular memory bank 216 before the apparatus 200 would start on its own. In another embodiment, the command interface 224, PDT 222, and/or PDC 220 may be configured to automatically wake a target memory bank 216 when a memory access request for that particular memory bank 216 occurs. However, the handshake command process is described in more detail herein.

In various embodiments, if the power down mode is a deep power down mode, the memory bank 216 may require initialization as part of the wake-up process. In that case, the time required to perform the initialization process may occur between the handshake command and a subsequent memory access to the memory bank 216. For example, the memory controller may respond to the first memory access request (to a powered down memory bank 216) with a memory access denial or miss response and substantially simultaneously send a handshake or wake-up command to the memory bank 216. As the processor (or other requesting device) recovers from the miss response, the memory bank 216 may be initializing and waking-up. By the time a second or subsequent memory access request to the memory bank 216 (e.g., a pre-load write command, etc.) is encountered, the memory bank 216 may be initialized and fully awake (in a high or normal operation power mode) and able to service the memory access request. In such an embodiment, the handshake command may allow part of the delay caused by the initialization or wake-up procedure to be hidden from the requesting device (e.g. a processor).

Figure 3:
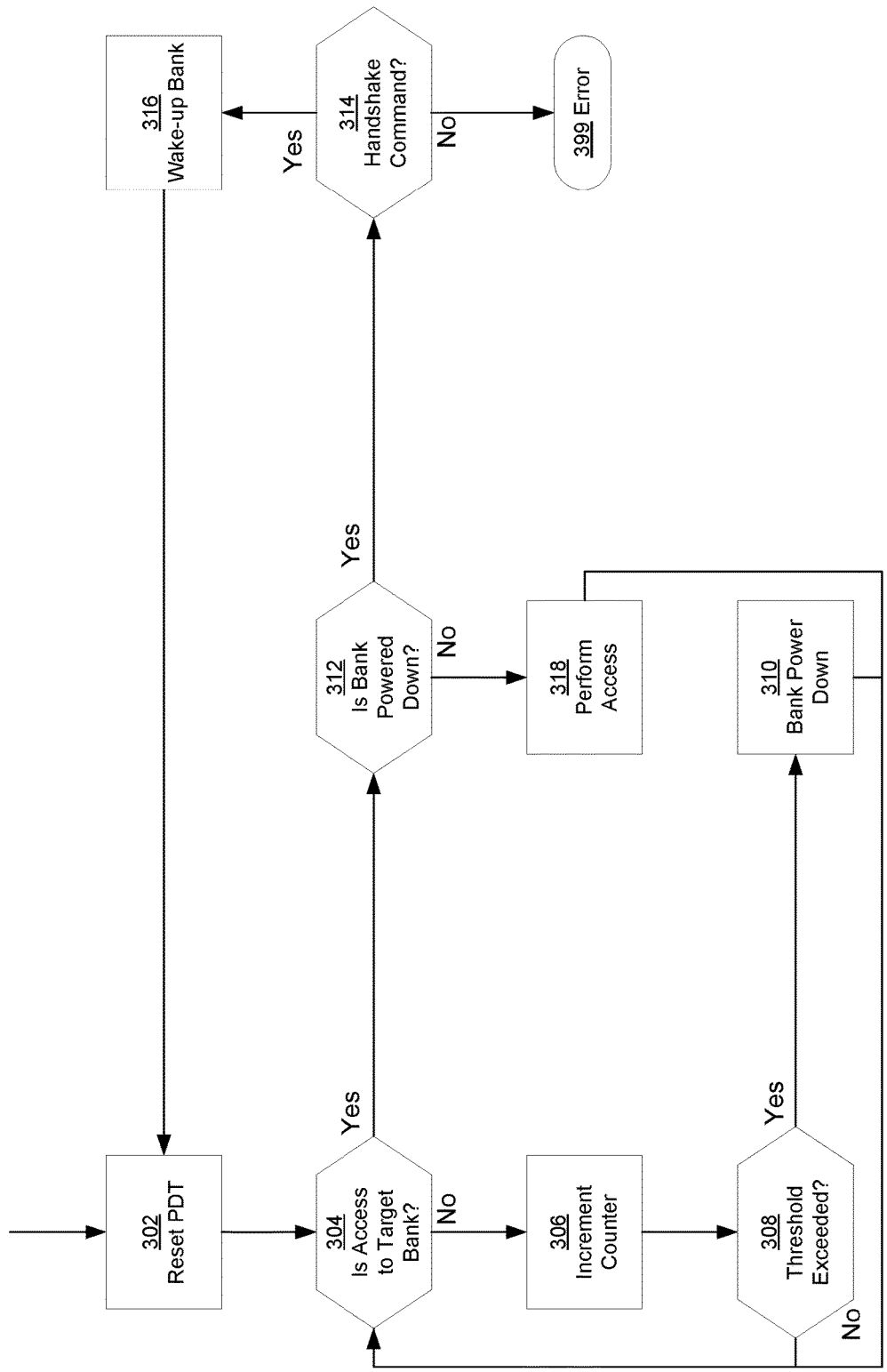
FIG. 3 is a flowchart of an example embodiment of a technique in accordance with the disclosed subject matter.

FIG. 3 is a flowchart of an example embodiment of a technique 300 in accordance with the disclosed subject matter. In various embodiments, the technique 300 may be used or produced by the systems such as those of FIG. 1 or 2. Specifically, in various embodiments, the technique 300 may be employed by a state-machine or PDT of the memory module. Although, it is understood that the above are merely a few illustrative examples to which the disclosed subject matter is not limited. It is understood that the disclosed subject matter is not limited to the ordering of or number of actions illustrated by technique 300.

Block 302 illustrates that, in one embodiment, the PDT may be reset. In various embodiments, this may include placing the respective memory bank into a high power or normal operating mode. This may also include setting the sleep counter to a predetermined or default value (e.g., zero). In some embodiments, this may also include initializing the memory cells or memory bank in general to a known state.

Block 304 illustrates that, in one embodiment, once the PDTs have been initialized or reset, the PDT may check if a memory access request is addressed or targets the respective memory bank. In some embodiments, this check may be performed every clock cycle. It is understood that the above is merely one illustrative example to which the disclosed subject matter is not limited.

In various embodiments, if there is no memory access request targeting the memory bank, the sleep counter may increment (or decrement depending upon the embodiment), as shown by Block 306. Conversely, if a memory access request is targeting the memory bank, the sleep counter may be reset.

Block 308 illustrates that, in one embodiment, a check may be made as to whether or not the sleep counter has exceeded the sleep threshold. If the sleep counter meets or exceeds the sleep threshold, it may indicate that the memory bank has not been accessed in some time. In such an embodiment, the memory bank may be placed in a low power mode.

In various embodiments where multiple power down modes are employed, multiple sleep threshold values may be used, and the counter value may be checked against these multiple thresholds. In such an embodiment, the memory bank may be placed into a deeper and deeper power down mode as the counter increases and exceeds multiple thresholds. It is understood that the above is merely one illustrative example to which the disclosed subject matter is not limited.

Block 310 illustrates that, in one embodiment, once the sleep threshold is exceeded, the memory bank may be placed into the power down mode. In various embodiments, the low power mode may include a deep power down state. As described above, the infrequent access of the memory bank may indicate that powering down (at least partially) the memory bank will have little effect upon the performance of the system that includes the memory bank.

In various embodiments, once the memory bank is powered down, the PDT state machine may return to Block 304. In some embodiments, once the memory bank is in a low power mode, the sleep counter may stop counting. In another embodiment, if multiple low power modes are employed, the sleep counter may continue to count if the memory bank is not in the lowest power mode. It is understood that the above are merely a few illustrative examples to which the disclosed subject matter is not limited.

As described above, the memory controller may send a command or memory access request to the memory module and more specifically the memory bank. Block 304 illustrates that, in one embodiment, any memory access requests or commands may be tested to see if the target memory bank is the memory bank associated with the PDT. If so, the sleep counter may not increment, as described above.

Instead, block 312 illustrates that, in one embodiment, a check may be made to determine if the memory bank is in a powered down state. Block 381 illustrates that, in one embodiment, if the memory bank is not in a power down mode, the memory access may be performed or fulfilled as normal.

Block 314 illustrates that, in one embodiment, if the memory bank is in the power down state, it may be determined whether or not the received command is the handshake or wake-up command. In various embodiments, the handshake command may include a precharge command. A precharge command may be configured to deactivate or close one or more rows in a memory bank. Generally, the memory bank may not be used again until a subsequent command is given. The memory bank may be placed in an idle state, and requires an ACTIVE command to be issued before any READ or WRITE commands. In various embodiments, the handshake command may make use of another command, either a preexisting memory command or a specialized command that wakes the particular memory bank from the low power mode.

Block 316 illustrates that, in one embodiment, if the handshake command is received, the memory bank may be removed or woken from the power down mode. In various embodiments, this may include placing the memory bank back in the high power or normal operation state. As part of waking up the memory bank, the memory bank and PDT may be reset to a known state (as illustrated by Block 302).

Block 399 illustrates that, in one embodiment, if the targeting command is not the expected handshake command, an error may occur or be generated. In some embodiments, the error may be unrecoverable and may require that the memory module or system as a whole be reset. In another embodiment, the unexpected memory command may simply be ignored. In yet another embodiment, the error may be passed up to the memory controller for further processing (e.g. a miss response may be generated). It is understood that the above are merely a few illustrative examples to which the disclosed subject matter is not limited.

Figure 4:
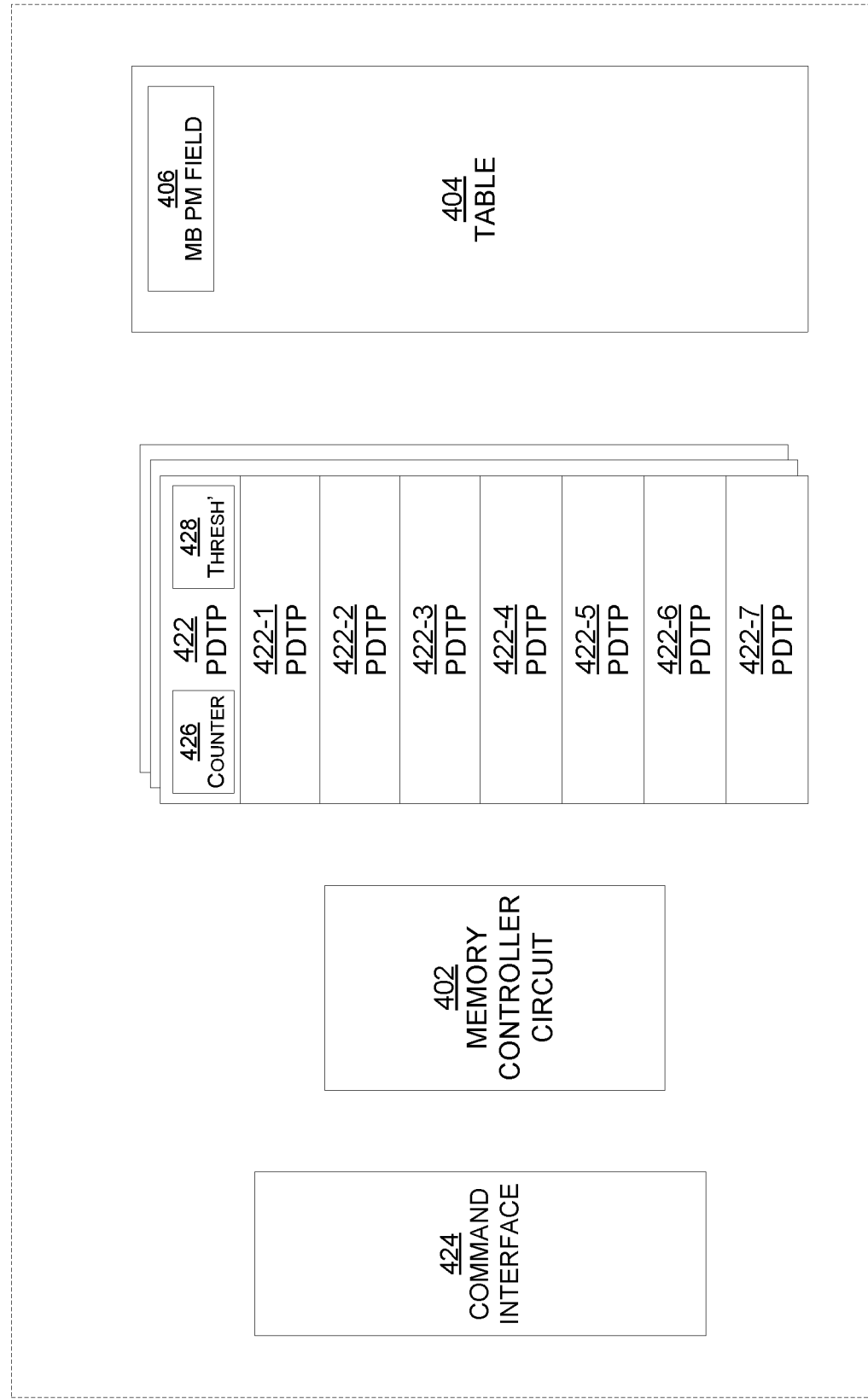
FIG. 4 is a block diagram of an example embodiment of an apparatus in accordance with the disclosed subject matter.

FIG. 4 is a block diagram of an example embodiment of an apparatus 400 in accordance with the disclosed subject matter. In various embodiments, the apparatus 400 may be or include a memory controller (e.g., the memory control 104 of FIG. 1). In such an embodiment, the apparatus 400 may be configured to manage the flow of data going to and from a memory module or other memory device.

In the illustrated embodiment, the apparatus 400 may include a command interface 424. The command interface 424 may be configured to transmit commands and/or memory access requests to a memory module. Specifically, the command interface 424 may be configured to transmit a handshake command to the memory module, wherein the handshake command is configured to remove an indicated memory bank from power down mode as described above. In addition, the command interface 424 may be configured to receive memory access requests from a processor or other initiating device, and transmit memory access responses back to the initiating device.

In the illustrated embodiment, the apparatus 400 may include a memory controller circuit 402. The memory controller circuit 402 may be configured to manage a flow of data going to and from a memory module. The memory controller circuit 402 may also be configured to respond to memory access requests and instruct the command interface 424 to send various commands or memory access messages (e.g., request, responses, etc.).

In the illustrated embodiment, the apparatus 400 may include a plurality of power down trigger predictors (PDTPs) 422. Each PDTP 422 may be associated with a memory bank of a memory module. In the illustrated embodiment, if each memory module includes eight memory banks, the apparatus 400 may include eight PDTs: PDTP 422, PDTP 422-1, PDTP 422-2, PDTP 422-3, PDTP 422-4, PDTP 422-5, PDTP 422-6, and PDTP 422-7; it is understood that the above is merely one illustrative example to which the disclosed subject matter is not limited. If the system includes multiple memory modules the number of PDTs 422 may be further increased. For example, if the system includes or four memory modules with eight memory banks per memory module, a total of 32 PDTs 422 may be included in the apparatus 400. It is understood that the above is merely one illustrative example to which the disclosed subject matter is not limited.

In the illustrated embodiment, the PDTP 422 may include a sleep counter 426 and a sleep threshold 428. In such an embodiment, the sleep counter 426 and sleep threshold 428 may be analogous to their counterparts in the memory modules. In various embodiments, a sleep threshold may be shared by all of the PDTs 422 or PDTs 422 associated with a common memory module. It is understood that the above are merely a few illustrative examples to which the disclosed subject matter is not limited.

In various embodiments, each PDTP 422 may be configured to predict if a respective memory bank is in a power down mode. In such an embodiment, each PDTP 422 may substantially mirror or duplicate a corresponding PDT included in the memory module and be associated with the same respective memory bank. This may allow the memory controller to predict the power mode of the memory banks. The apparatus 400 may receive any commands sent to the memory modules, and therefore the PDTP 422 may trigger in essentially the exact same way as the memory module's PDTs. One key difference may be that the apparatus sees or is aware of any commands a certain number of clock cycles ahead of the memory module (as the apparatus 400 may receive the commands and then forward them to the memory module). A version of the PDTs 422 is described below in reference to FIG. 5.

In the illustrated embodiment, the apparatus 400 may include a table 404 or memory configured to store a table 404. The table 404 may be configured to indicate which, if any memory banks of the memory module(s) are in a power down mode. More generally, the table 404 may be configured to indicate the current or predicted operating or power mode of the memory banks. In such an embodiment, each memory bank may be associated with a memory bank power mode field 406 that stores the predicted power mode of the respective memory bank.

In various embodiments, the memory modules may be configured to transmit a message to the apparatus 400 whenever a memory bank is placed in a low power mode, or even changes its power mode. In such an embodiment, the apparatus 400 may be configured to update the table 404 upon receipt of the message. In such an embodiment, the apparatus 400 may not include respective PDTs 422. However, that is not the illustrated embodiment.

In the illustrated embodiment, once the apparatus 400 receives (via the command interface 424) a memory access request for a targeted memory bank, the apparatus 400 may be configured to check with the table 404 to determine if the target memory bank is in a power down or low power mode (or if it is in a high power or normal operating mode). If the target memory bank is in a power down mode, the apparatus 400 may respond to the memory access request with a miss to the initiating device.

Substantially simultaneously the apparatus 400 may also send a handshake command to the target memory bank. The handshake command may be configured to wake the targeted memory bank from the sleeping or powered down mode. In various embodiments, the handshake command may include a precharge command, as described above. In such an embodiment, the target memory bank may be awake when a second or subsequent memory access is received. It is understood that the above is merely one illustrative example to which the disclosed subject matter is not limited.

Figure 5:
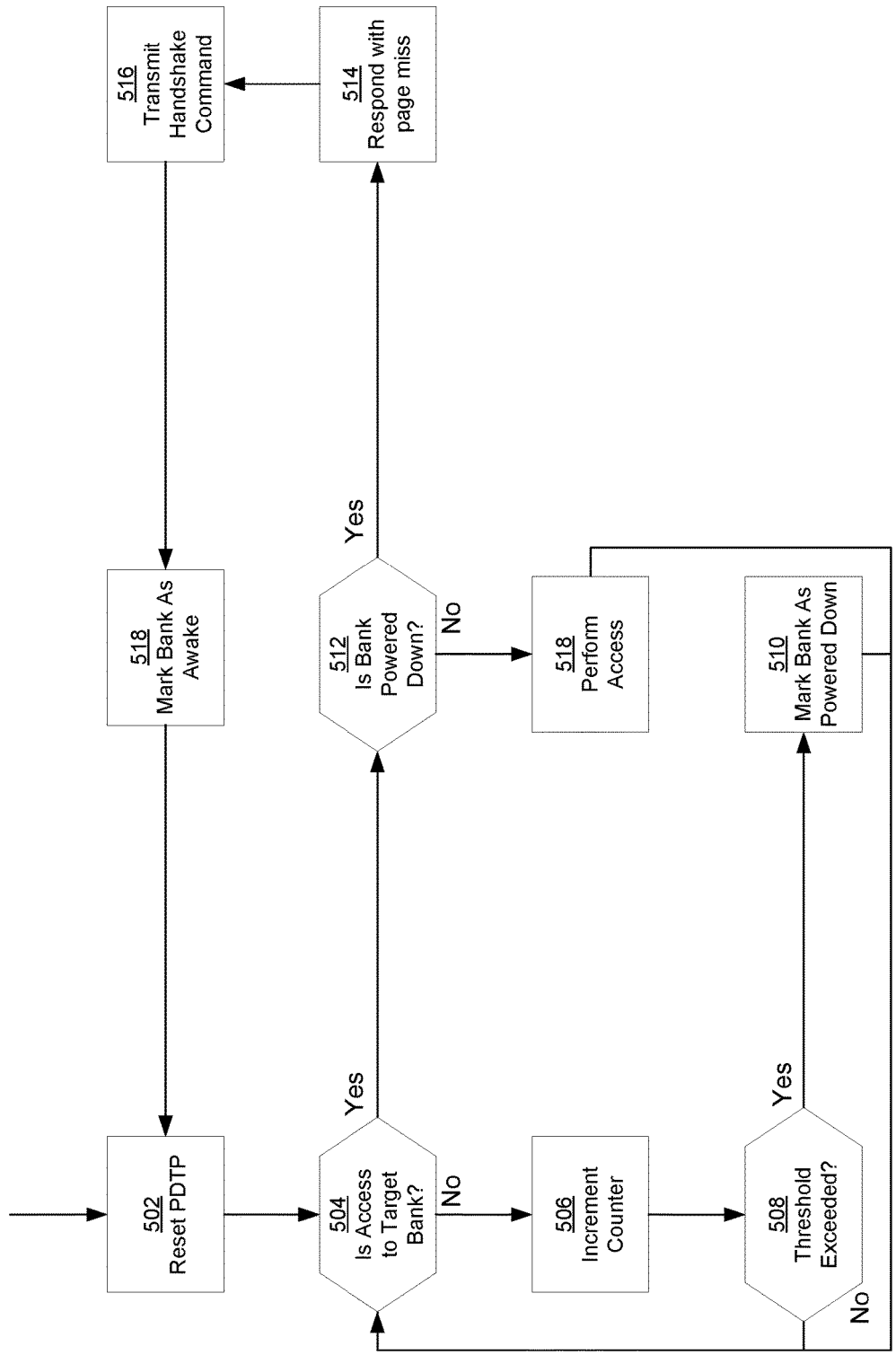
FIG. 5 is a flowchart of an example embodiment of a technique in accordance with the disclosed subject matter.

FIG. 5 is a flowchart of an example embodiment of a technique 500 in accordance with the disclosed subject matter. In various embodiments, the technique 500 may be used or produced by the systems such as those of FIG. 1 or 4. The technique 500 may be employed by a state machine of a memory controller's PDTP. Although, it is understood that the above are merely a few illustrative examples to which the disclosed subject matter is not limited. It is understood that the disclosed subject matter is not limited to the ordering of or number of actions illustrated by technique 500.

The technique 500 that may be employed by the PDTP of a memory controller may be very similar to the technique employed by the PDT of the memory module. This may allow the memory controller to predict or know the power state of a respective memory bank. Further, by acting independently, the separate PDT/PDTPs (in the memory controller and memory module) may allow the memory module to place memory banks in a power down mode without the need to receive commands form the memory controller.

Block 502 illustrates that, in one embodiment, the PDTP may be reset. In various embodiments, this may include placing or marking the respective memory bank as being in a high power or normal operating mode. This may also include setting the sleep counter to a predetermined or default value (e.g., zero). In some embodiments, this may also include initializing the memory cells or memory bank in general to a known state.

Block 504 illustrates that, in one embodiment, once the PDTPs have been initialized or reset, the PDTP may check if a memory access request is addressed or targets the respective memory bank. In some embodiments, this check may be performed every clock cycle. It is understood that the above is merely one illustrative example to which the disclosed subject matter is not limited.

In various embodiments, if there is no memory access request targeting the memory bank, the sleep counter may increment (or decrement depending upon the embodiment), as shown by Block 506. Conversely, if a memory access request is targeting the memory bank, the sleep counter may reset.

Block 508 illustrates that, in one embodiment, a check may be made as to whether or not the sleep counter has exceeded the sleep threshold. If the sleep counter meets or exceeds the sleep trigger, it indicates that the memory bank has not been accessed in some time. In such an embodiment, the memory bank may be placed in (or marked as being in) a low power mode.

Block 510 illustrates that, in one embodiment, once the sleep threshold is exceeded, the memory bank may be placed into (or marked as being in) the power down mode. The memory controller may indicate this by updating that table entry for the memory bank to indicate that the memory bank is in a power down mode.

In various embodiments, once the memory bank is powered down, the PDTP state machine may return to Block 504. As described above, the memory controller may send a command or memory access request to the memory module and more specifically the memory bank. Block 504 illustrates that, in one embodiment, any memory access requests or commands may be tested to see if the target memory bank is the memory bank associated with the PDTP. If so, the sleep counter may not increment, as described above.

Block 512 illustrates that, in one embodiment, if the memory access request or command targets the memory bank, a check may be made to determine if the memory bank is in a powered down state. Block 518 illustrates that, in one embodiment, if the memory bank is not in a power down mode, the memory access may be performed, as normal. In such an embodiment, the memory controller may forward the memory access request to the memory module, or may generate a new command that fulfills the received memory access request.

Block 514 illustrates that, in one embodiment, if the memory bank is in the power down state, the memory controller may respond to the processor or initiating device with a miss response that indicates that the requested memory access cannot be fulfilled.

Block 516 illustrates that, in one embodiment, the memory controller may transmit a handshake or wake-up command to the memory module and more specifically to the targeted memory bank. As described above, the handshake command may be configured to wake the memory bank from the power down mode and make it available for access when any future memory access requests are received.

Block 518 illustrates that, in one embodiment, if the handshake command is transmitted, the memory bank's entry in the table may be altered to indicate that it is no longer in power down mode. As part of waking up the memory bank, the PDTP may be reset to a known state (as illustrated by Block 502).

Figure 6:
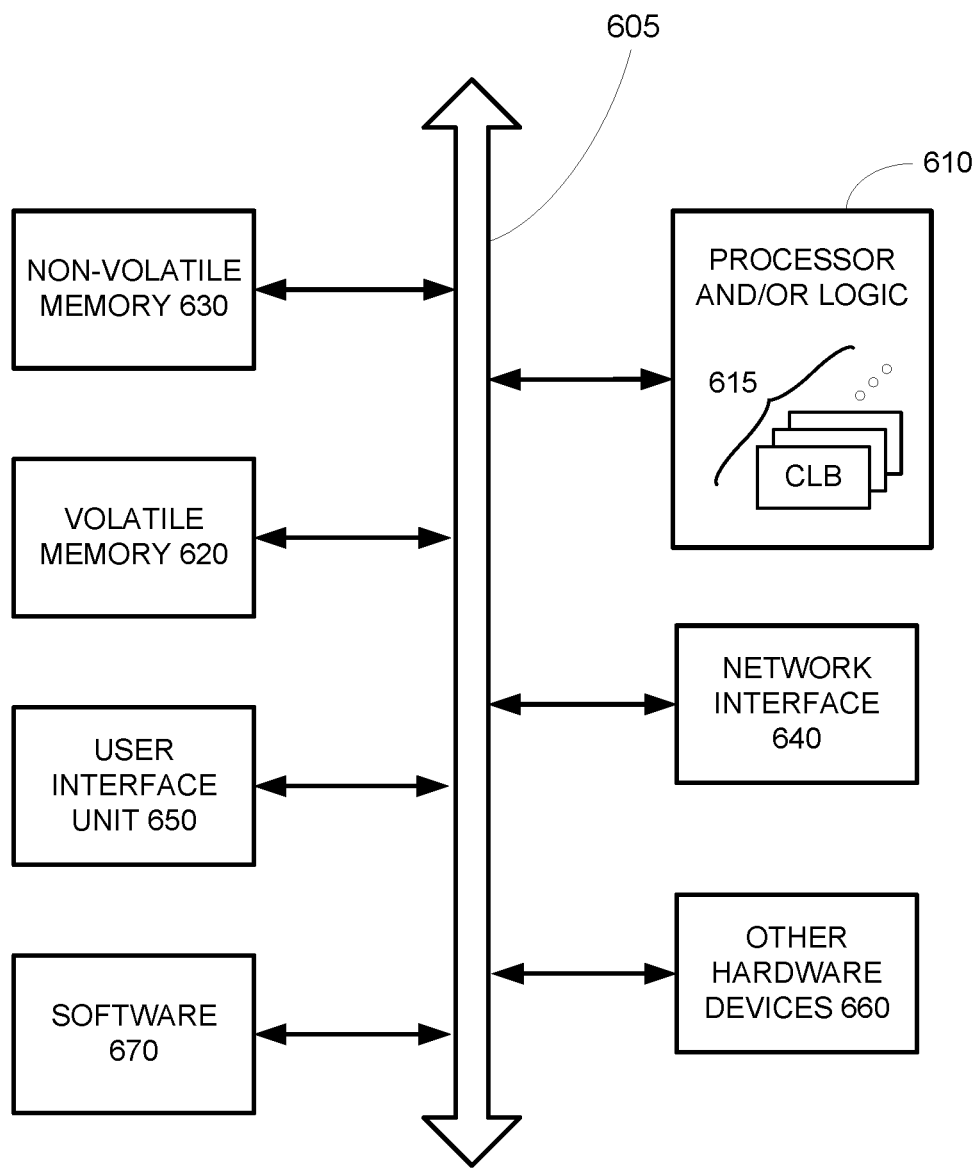
FIG. 6 is a schematic block diagram of an information processing system that may include devices formed according to principles of the disclosed subject matter.

FIG. 6 is a schematic block diagram of an information processing system 600, which may include semiconductor devices formed according to principles of the disclosed subject matter.

Referring to FIG. 6, an information processing system 600 may include one or more of devices constructed according to the principles of the disclosed subject matter. In another embodiment, the information processing system 600 may employ or execute one or more techniques according to the principles of the disclosed subject matter.

In various embodiments, the information processing system 600 may include a computing device, such as, for example, a laptop, desktop, workstation, server, blade server, personal digital assistant, smartphone, tablet, and other appropriate computers, etc. or a virtual machine or virtual computing device thereof. In various embodiments, the information processing system 600 may be used by a user (not shown).

The information processing system 600 according to the disclosed subject matter may further include a central processing unit (CPU), logic, or processor 610. In some embodiments, the processor 610 may include one or more functional unit blocks (FUBs) or combinational logic blocks (CLBs) 615. In such an embodiment, a combinational logic block may include various Boolean logic operations (e.g., NAND, NOR, NOT, XOR, etc.), stabilizing logic devices (e.g., flip-flops, latches, etc.), other logic devices, or a combination thereof. These combinational logic operations may be configured in simple or complex fashion to process input signals to achieve a desired result. It is understood that while a few illustrative examples of synchronous combinational logic operations are described, the disclosed subject matter is not so limited and may include asynchronous operations, or a mixture thereof. In one embodiment, the combinational logic operations may comprise a plurality of complementary metal oxide semiconductors (CMOS) transistors. In various embodiments, these CMOS transistors may be arranged into gates that perform the logical operations; although it is understood that other technologies may be used and are within the scope of the disclosed subject matter.

The information processing system 600 according to the disclosed subject matter may further include a volatile memory 620 (e.g., a Random Access Memory (RAM), etc.). The information processing system 600 according to the disclosed subject matter may further include a non-volatile memory 630 (e.g., a hard drive, an optical memory, a NAND or Flash memory, etc.). In some embodiments, either the volatile memory 620, the non-volatile memory 630, or a combination or portions thereof may be referred to as a "storage medium". In various embodiments, the volatile memory 620 and/or the non-volatile memory 630 may be configured to store data in a semi-permanent or substantially permanent form.

In various embodiments, the information processing system 600 may include one or more network interfaces 640 configured to allow the information processing system 600 to be part of and communicate via a communications network. Examples of a Wi-Fi protocol may include, but are not limited to, Institute of Electrical and Electronics Engineers (IEEE) 802.11g, IEEE 802.11n, etc. Examples of a cellular protocol may include, but are not limited to: IEEE 802.16m (a.k.a. Wireless-MAN (Metropolitan Area Network) Advanced), Long Term Evolution (LTE) Advanced), Enhanced Data rates for GSM (Global System for Mobile Communications) Evolution (EDGE), Evolved High-Speed Packet Access (HSPA+), etc. Examples of a wired protocol may include, but are not limited to, IEEE 802.3 (a.k.a. Ethernet), Fibre Channel, Power Line communication (e.g., HomePlug, IEEE 1901, etc.), etc. It is understood that the above are merely a few illustrative examples to which the disclosed subject matter is not limited.

The information processing system 600 according to the disclosed subject matter may further include a user interface unit 650 (e.g., a display adapter, a haptic interface, a human interface device, etc.). In various embodiments, this user interface unit 650 may be configured to either receive input from a user and/or provide output to a user. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

In various embodiments, the information processing system 600 may include one or more other devices or hardware components 660 (e.g., a display or monitor, a keyboard, a mouse, a camera, a fingerprint reader, a video processor, etc.). It is understood that the above are merely a few illustrative examples to which the disclosed subject matter is not limited.

The information processing system 600 according to the disclosed subject matter may further include one or more system buses 605. In such an embodiment, the system bus 605 may be configured to communicatively couple the processor 610, the volatile memory 620, the non-volatile memory 630, the network interface 640, the user interface unit 650, and one or more hardware components 660. Data processed by the processor 610 or data inputted from outside of the non-volatile memory 630 may be stored in either the non-volatile memory 630 or the volatile memory 620.

In various embodiments, the information processing system 600 may include or execute one or more software components 670. In some embodiments, the software components 670 may include an operating system (OS) and/or an application. In some embodiments, the OS may be configured to provide one or more services to an application and manage or act as an intermediary between the application and the various hardware components (e.g., the processor 610, a network interface 640, etc.) of the information processing system 600. In such an embodiment, the information processing system 600 may include one or more native applications, which may be installed locally (e.g., within the non-volatile memory 630, etc.) and configured to be executed directly by the processor 610 and directly interact with the OS. In such an embodiment, the native applications may include pre-compiled machine executable code. In some embodiments, the native applications may include a script interpreter (e.g., C shell (csh), AppleScript, AutoHotkey, etc.) or a virtual execution machine (VM) (e.g., the Java Virtual Machine, the Microsoft Common Language Runtime, etc.) that are configured to translate source or object code into executable code which is then executed by the processor 610.

The semiconductor devices described above may be encapsulated using various packaging techniques. For example, semiconductor devices constructed according to principles of the disclosed subject matter may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, a wafer-level processed stack package (WSP) technique, or other technique as will be known to those skilled in the art.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

In various embodiments, a computer readable medium may include instructions that, when executed, cause a device to perform at least a portion of the method steps. In some embodiments, the computer readable medium may be included in a magnetic medium, optical medium, other medium, or a combination thereof (e.g., CD-ROM, hard drive, a read-only memory, a flash drive, etc.). In such an embodiment, the computer readable medium may be a tangibly and non-transitorily embodied article of manufacture.

While the principles of the disclosed subject matter have been described with reference to example embodiments, it will be apparent to those skilled in the art that various changes and modifications may be made thereto without departing from the spirit and scope of these disclosed concepts. Therefore, it should be understood that the above embodiments are not limiting, but are illustrative only. Thus, the scope of the disclosed concepts are to be determined by the broadest permissible interpretation of the following claims and their equivalents, and should not be restricted or limited by the foregoing description. It is, therefore, to be understood that the appended claims are intended to cover all such modifications and changes as fall within the scope of the embodiments.

What is claimed is:

1. An apparatus, comprising:
a memory module comprising:
a first memory bank configured to operate in a first power mode and a second power mode, wherein the second power mode is associated with reduced power consumption relative to the first power mode;
a second memory bank configured to operate in the first power mode and the second power mode;
a first processor circuit configured to place the first memory bank in the second power mode;
a second processor circuit configured to place the second memory bank in the second power mode, wherein the first processor circuit is further configured to maintain a first counter and to place the first memory bank in the second power mode based, at least in part, on a first value of the first counter; and
a memory controller circuit configured to maintain a second counter, wherein the first counter and the second counter are different from each other.

2. The apparatus of claim 1,
wherein the second processor circuit is further configured to maintain a third counter and to place the second memory bank in the second power mode based, at least in part, on a second value of the third counter.

3. The apparatus of claim 1, wherein the first processor circuit comprises a first field programmable gate array (FPGA) or first application-specific integrated circuit (ASIC), and
wherein the second processor circuit comprises a second FPGA or a second ASIC.

4. The apparatus of claim 1, wherein the memory controller circuit is further configured to initiate transition of the first memory bank from the second power mode to the first power mode in response to a memory access-request command to the first memory bank.

5. The apparatus of claim 4, wherein the memory controller circuit is further configured to generate a predicted power state of the first memory bank, and
wherein the memory controller circuit initiates transition of the first memory bank to the first power mode based, at least in part, on the predicted power state.

6. The apparatus of claim 5, wherein the memory controller circuit is further configured to generate the predicted power state of the first processor circuit based, at least in part, on a second value of the second counter.

* * * * *